(12) United States Patent
Ishimatsu et al.

(10) Patent No.: US 11,402,408 B2
(45) Date of Patent: Aug. 2, 2022

(54) ELECTRICAL CHARACTERISTICS INSPECTION TOOL

(71) Applicant: DEXERIALS CORPORATION, Tokyo (JP)

(72) Inventors: Tomoyuki Ishimatsu, Tochigi (JP); Hiroyuki Kumakura, Tochigi (JP); Masaharu Aoki, Tochigi (JP); Takako Kubota, Tochigi (JP)

(73) Assignee: DEXERIALS CORPORATION, Tokyo (JP)

( * ) Notice: Subject to any disclaimer, the term of this patent is extended or adjusted under 35 U.S.C. 154(b) by 135 days.

(21) Appl. No.: 16/478,846

(22) PCT Filed: Jan. 16, 2018

(86) PCT No.: PCT/JP2018/001030
§ 371 (c)(1),
(2) Date: Jul. 17, 2019

(87) PCT Pub. No.: WO2018/155005
PCT Pub. Date: Aug. 30, 2018

(65) Prior Publication Data
US 2020/0141978 A1 May 7, 2020

(30) Foreign Application Priority Data
Feb. 27, 2017 (JP) .............................. JP2017-034459

(51) Int. Cl.
*G01R 1/073* (2006.01)
*G01R 31/26* (2020.01)
(Continued)

(52) U.S. Cl.
CPC ............. *G01R 1/0735* (2013.01); *G01R 3/00* (2013.01); *G01R 31/26* (2013.01); *H01R 12/51* (2013.01)

(58) Field of Classification Search
CPC ....... G01R 1/0735; G01R 31/26; H01R 12/51
See application file for complete search history.

(56) References Cited

U.S. PATENT DOCUMENTS

| 6,246,245 B1 | 6/2001 | Akram et al. |
| 9,423,419 B2 | 8/2016 | Lee |
| 2015/0377923 A1 | 12/2015 | Lee |

FOREIGN PATENT DOCUMENTS

| CN | 105008940 A | 10/2015 |
| JP | 2001-066341 A | 3/2001 |

(Continued)

OTHER PUBLICATIONS

May 13, 2020 Office Action issued in Korean Patent Application No. 10-2019-7020594.
(Continued)

*Primary Examiner* — Paresh Patel
(74) *Attorney, Agent, or Firm* — Oliff PLC (57) ABSTRACT

An electrical characteristics inspection tool capable of inspecting electrical characteristics even when an oxide film is formed on pads or bumps formed at a fine pitch. The electrical characteristics inspection tool includes: a flexible sheet; a through electrode having a recess that is recessed from one surface of the flexible sheet; and a conductive elastomer disposed in the recess of the through electrode. Electrical characteristics can be inspected even when an oxide film is formed on pads or bumps of an inspection object by bringing the conductive elastomer into contact with the pads or bumps and bringing a probe into contact with the through electrode since the conductive particles in the conductive elastomer break through the oxide film.

17 Claims, 3 Drawing Sheets

| (51) | Int. Cl. | | | TW | 201400829 A | 1/2014 |
| --- | --- | --- | --- | --- | --- | --- |
| | *H01R 12/51* | (2011.01) | | TW | 201517398 A | 5/2015 |
| | *G01R 3/00* | (2006.01) | | WO | 2015030357 A1 | 3/2015 |

(56) References Cited

FOREIGN PATENT DOCUMENTS

| JP | 2001-093945 A | | 4/2001 | |
| --- | --- | --- | --- | --- |
| JP | 2001-239526 A | | 9/2001 | |
| JP | 2004-294144 A | | 10/2004 | |
| JP | 2006-024580 A | | 1/2006 | |
| JP | 2006-090772 A | | 4/2006 | |
| JP | 2006090772 A | * | 4/2006 | |
| JP | 2007-064673 A | | 3/2007 | |
| JP | 2007-064673 A | | 3/2007 | |
| JP | 2007064673 A | * | 3/2007 | |
| JP | 2007-085833 A | | 4/2007 | |
| JP | 2007134048 A | * | 5/2007 | ............... G01R 3/00 |
| JP | 2009-042008 A | | 2/2009 | |
| KR | 100926777 B1 | | 11/2009 | |

OTHER PUBLICATIONS

Dec. 25, 2020 Office Action issued in Japanese Patent Application No. 2017-034459.
Apr. 3, 2018 International Search Report issued in International Patent Application No. PCT/JP2018/001030.
Mar. 23, 2021 Office Action issued in Chinese Patent Application No. 201880011291.0.
Aug. 17, 2021 Office Action issued in Taiwanese Patent Application No. 107105500.
Oct. 27, 2021 Office Action issued in Chinese Patent Application No. 201880011291.0.
Mar. 29, 2022 Office Action issued in Taiwanese Patent Application No. 107105500.
Apr. 11, 2022 Office Action issued in Chinese Patent Application No. 201880011291.0.

\* cited by examiner

ELECTRICAL CHARACTERISTICS INSPECTION TOOL

TECHNICAL FIELD

The present technology relates to an electrical characteristics inspection tool for electronic components such as wafers, chips, and packages. This application claims priority based on Japanese Patent Application No. 2017-034459 filed on Feb. 27, 2017 in Japan, which is incorporated into the present application by reference.

BACKGROUND ART

Currently, electrical characteristics of semiconductor devices at wafer level are evaluated with a probe card by bringing probes into direct contact with conductive pads or a bumps formed on the front and back surfaces of a wafer (see, for example, Patent Document 1).

This method enables inspection before packaging and three-dimensional mounting.

However, since this method scratches a pad surface of a wafer to remove an oxide film on the pad surface in order to perform a probe inspection, there may be cases in which the mounted product having passed the inspection is rejected later due to damages caused by inspection. Further, smaller pads are more sensitive to the damages caused by inspection, resulting in defects in bump formation and mounting. In recent years, in particular, as the fine-pitching of semiconductor chips is further advanced, damages caused by the inspection are increasingly problematic.

For bare chips and packages, handler tests are performed by using rubber connectors. As a rubber connector used as an inspection probe sheet, there has been proposed, for example, an anisotropic conductive sheet in which conductive particles having a magnetic field orientation are arranged to penetrate in the thickness direction of an elastomer sheet (see, PLT 2, for example).

The inspection probe sheet described in PLT 2 is difficult to apply to fine pitches since the conductive particles are connected in the in-plane direction when the magnetic field of the conductive particles is oriented in the rubber elastic elastomer resin. In addition, although a frame is provided to surround the perimeter for the purpose of improving durability, the elastomer resin inside the frame is a material that easily expands and contracts due to thermal expansion, which deteriorates durability and causes inspection failure due to contact deviation (positional deviation). In particular, positional deviation in a heat cycle test is fatal, and it will be difficult to apply to further fine pitching in the future.

Also, in general, rubber connectors in which a conductive material is placed in an elastomer resin make it difficult to manufacture a connector with a fine pitch, for example, an inspection connector at a level of 200 μm P or less. For this reason, in practice, inspections are performed on assembled packages, which extremely deteriorates yields and makes it difficult to reduce the price.

PRIOR ART LITERATURE

Patent Literatures

PLT 1: Japanese Patent Application Publication No. 2009-042008

PLT 2: Japanese Patent Application Publication No. 2006-024580

SUMMARY OF THE INVENTION

Problem to be Solved by the Invention

In view of such conventional circumstances, the present technology provides an electrical characteristics inspection tool capable of inspecting electrical characteristics even when an oxide film is formed on pads or bumps formed at a fine pitch.

Solution to Problem

As a result of earnest investigation, the present inventors have found that by arranging a conductive elastomer in a recess of a through electrode formed in a flexible sheet, electrical characteristics can be inspected even when an oxide film is formed on pads or bumps formed at a fine pitch.

That is, an electrical characteristics inspection tool according to the present technology includes a flexible sheet, a through electrode having a recess that is recessed from one surface of the flexible sheet, and a conductive elastomer disposed in the recess of the through electrode.

Furthermore, an electrical characteristics inspection method according to the present technology includes a pasting step of pasting, on an electrode surface of an inspection object, an inspection probe sheet including a flexible sheet, a through electrode having a recess that is recessed from one surface of the flexible sheet, and a conductive elastomer disposed in the recess of the through electrode to bring the conductive elastomer into contact with the electrode of the inspection object, and an inspection step of pressing a probe against the through electrode from the other surface of the flexible sheet, and inspecting electrical characteristics.

Advantageous Effects of Invention

According to the present technology, electrical characteristics can be inspected even when an oxide film is formed on pads or bumps of an inspection object, by bringing a conductive elastomer into contact with the pads or bumps and bringing a probe into contact with the through electrode. This is considered to be because the conductive particles in the conductive elastomer break through the oxide film, or electricity flows through the thin oxide film due to the tunnel effect.

DESCRIPTION OF EMBODIMENTS

Hereinafter, embodiments of the present technology will be described in detail in the following order.
1. Electrical Characteristics Inspection Tool
2. Electrical Characteristics Inspection Method
3. Manufacturing Method for Semiconductor Device
   1. Electrical Characteristics Inspection Tool An electrical characteristics inspection tool according to the present technology, which can also be called inspection probe sheet, includes a flexible sheet, a through electrode having a recess on one surface of the flexible sheet, and a conductive elastomer disposed in the recess of the through electrode. By bringing pads or bumps into contact with the conductive elastomer and bringing the probe into contact with the through electrode, even when an oxide film is formed on pads or bumps of the inspection object, electrical characteristics can be inspected since conductive particles in the conductive elastomer break through the oxide film, or electricity flows through the thin oxide film due to the tunnel effect.

The conductive elastomer can be shaped according to the shape of the pads or bumps of the inspection object and may protrude or recessed from one surface of the flexible sheet.

First Embodiment

Figure 1:
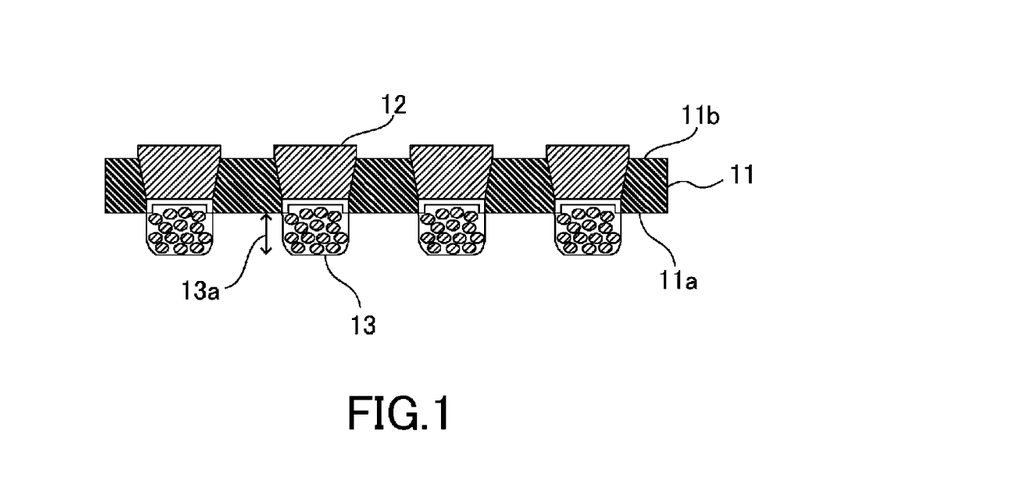
FIG. 1 is a cross-sectional view illustrating an example of an inspection probe sheet according to a first embodiment.
Figure 2:
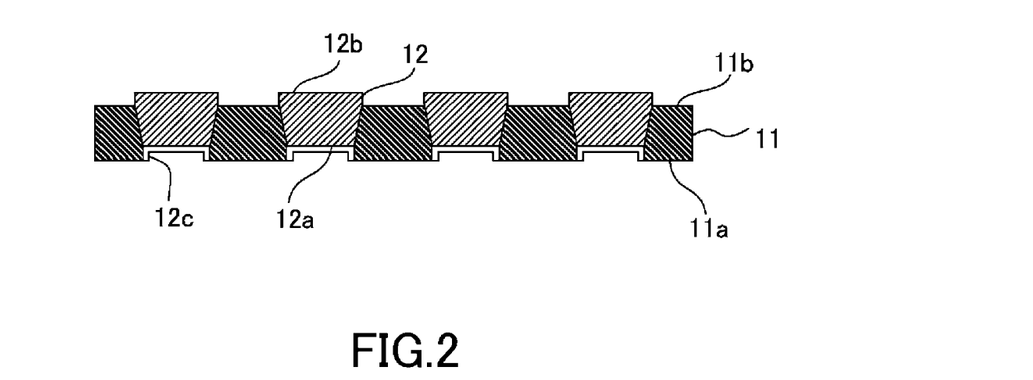
FIG. 2 is a cross-sectional view illustrating an example of a flexible sheet on which through electrodes are formed.

FIG. 1 is a cross-sectional view illustrating an example of an inspection probe sheet according to a first embodiment, and FIG. 2 is a cross-sectional view illustrating an example of a flexible sheet on which through electrodes are formed. An inspection probe sheet 10 according to the first embodiment includes a flexible sheet 11, a through electrode 12 having a recess 12a on one surface 11a of the flexible sheet 11, and a conductive elastomer 13 disposed in the recess 12a of the through electrode 12, in which a conductive elastomer 13 protrudes from the one surface 11a of the flexible sheet 11.

The flexible sheet 11 is preferably made of a material having flexibility, insulation property, a low thermal expansion coefficient, and a high heat resistance. Examples of the material of the flexible sheet 11 include polyimide, polyamide, polyethylene naphthalate, biaxially oriented polyethylene terephthalate, and liquid crystal polymer, among others. These materials are preferable comparing to elastic elastomers because these materials have better dimensional stability, hardly cause a conduction failure due to a positional deviation in the heat cycle test, and also have excellent durability. Among them, it is preferable to use a polyimide having excellent heat resistance.

The thickness of the flexible sheet 11 is preferably 5 micrometers or more, more preferably 10 micrometers or more, and still more preferably 20 micrometers or more because an excessively thin thickness will degrade the durability. In addition, the thickness of the flexible sheet 11 is preferably 500 micrometers or less, more preferably 100 micrometers or less, and still more preferably 50 micrometers or less because an excessively thick thickness will make it difficult to form the through electrodes.

The through electrodes 12 exist independently of one another and are insulated from the adjacent through electrodes, and may be formed in advance in accordance with the position of pads or bumps of the inspection object, or may be formed at a predetermined interval.

The through electrode 12 is formed in the thickness direction of the flexible sheet 11 and has a recess 12a that is recessed from the one surface of the flexible sheet 11. The depth of the recess 12a is preferably 20 to 80%, more preferably 40 to 80%, and still more preferably 60 to 80% of the thickness of the flexible sheet 11. This increases the thickness of the conductive elastomer 13 and thus the amount of movement when pressing down the inspection probe sheet 10 in order to follow variations in height of pads and bumps.

Further, the surface of the recess 12a of the through electrode 12 is preferably plated by Ni/Au plating, Ni/Pd plating, or Ni/Pd/Au plating, among others to be covered with a metal plating film. This improves adhesion to the conductive elastomer 13 by the anchor effect of the recess 12a, while improving durability and conductivity with the conductive elastomer 13.

The through electrode 12 preferably has a protrusion 12b that protrudes from the other surface of the flexible sheet 11. This enables the diameter of the wire probe tip to be larger than the diameter of the through electrode 12.

The through electrode 12 is made of a conductive metal or alloy, and is preferably made of a metal or alloy such as copper and nickel, among others. The through electrode 12 preferably has a so-called "tapered shape" the diameter of which increases from one surface 11a of the flexible sheet 11 to the other surface 11b. This enables the diameter of the tip of the wire probe to be larger than the size of the pads or bumps of the inspection object.

The conductive elastomer 13 protrudes from the one surface 11a of the flexible sheet 11. Insufficient protrusion heights of the conductive elastomer 13 will reduce the amount of movement when the inspection probe sheet 10 is pushed down and thus make it difficult to follow variations in height of pads and bumps. For this reason, the protrusion height of the conductive elastomer 13 is preferably 50% or more, more preferably 100% or more, and still more preferably 150% or more of the average particle diameter of the conductive particles. Moreover, excessive protrusion heights of the conductive elastomer 13 might cause breakage of the protrusion part and thus the height is preferably 400% or less, more preferably 300% or more, and still more preferably 250% or less of the average particle diameter of the conductive particles.

The conductive elastomer 13 includes conductive particles dispersed in elastic resin, thereby having a conductive property. The elastic resin should just have rubber elasticity, and it is preferable to have a heat resistance property. A preferable example of the elastic resin includes a silicone resin because it is preferable that residue do not adhere to the pads and bumps as much as possible after the inspection. This makes it possible to follow variations in heights of pads and bumps in a semiconductor wafer or a chip surface.

The conductive particles are linked from the through electrode 12, and the endmost portion is exposed from the outermost surface of the elastic resin, and the endmost portion and the through electrode 12 on the other surface of the flexible sheet 11 are electrically connected.

The conductive particles should just have conductivity, and it is preferable to use magnetic metal particles such as nickel, cobalt and iron, and particles in which a magnetic metal is plated on a resin core or inorganic core particles. In addition, the conductive particles may be plated by Ni/Au plating, Ni/Pd plating, or Ni/Pd/Au plating, among others, or coated with a metal plating film. In the case of the conductive particles containing a magnetic metal, applying a magnetic field when the conductive elastomer 13 is filled in the recess of the through electrode 12 easily links the conductive particles to connect from the through electrode 12 to the conductive particles in the surface layer of the elastic resin so that electrical conduction can be achieved.

Smaller particle diameters of the conductive particles can be applied to smaller pads and bumps; the particle diameter, therefore, is preferably 20 micrometers or less, more preferably 10 micrometers or less, and still more preferably 5 micrometers or less.

The shape of the conductive particles may be spherical, polygonal, or spiked shape. The conductive particles having a polygonal or spiked shape can more easily break through the oxide film of the pads or bumps of the inspection object.

Second Embodiment

Figure 3:
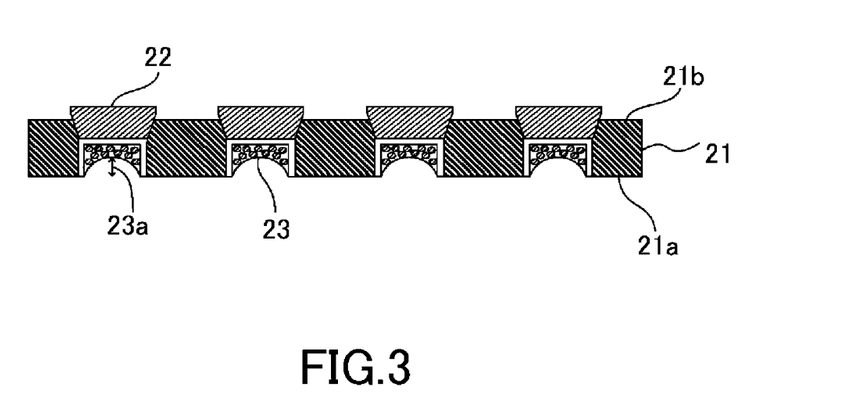
FIG. 3 is a cross-sectional view illustrating an example of an inspection probe sheet according to a second embodiment.

FIG. 3 is a cross-sectional view illustrating an example of an inspection probe sheet according to a second embodiment. An inspection probe sheet 20 according to the second embodiment includes a flexible sheet 21, a through electrode 22 having a recess on one surface 21a of the flexible sheet 21, and a conductive elastomer 23 disposed in the recess of the through electrode, in which the conductive elastomer 23 is recessed from the one surface 21a of the flexible sheet 21. Excessively shallow recession depth of the conductive elastomer 23 make the alignment with the bumps to be difficult and excessively deep depression depth cannot reach the bumps; therefore the depression depth is preferably 10% to 90%, more preferably 15% to 70%, and still more preferably 20% to 50% of the bump height.

The materials of the flexible sheet 21, the through electrode 22, and the conductive elastomer 23 of the inspection probe sheet 20 according to the second embodiment are similar to the flexible sheet 11, the through electrode 12, and the conductive elastomer 13 of the inspection probe sheet 10 according to the first embodiment, and further description is omitted here.

Method of Manufacturing Inspection Probe Sheet

Next, a method of manufacturing an inspection probe sheet is described. First, through holes are formed in the flexible sheet by laser processing, and half through electrodes are formed in the through holes by electrolytic plating to form recesses. Further, the through electrode and the side surface of the recess are preferably plated with Ni/Au plating, Ni/Pd plating, or Ni/Pd/Au plating, among others and covered with a metal plating film.

Next, using a microdispenser, the conductive elastomer dispersion is uniformly applied to the recess side of the through electrode on the one surface of the flexible sheet, and then a magnetic field is applied from below the through electrode on the one surface of the flexible sheet. As a result, in the case of the conductive particles containing a magnetic metal, when the conductive elastomer is filled in the recess of the through electrode, the conductive particles are easily linked to connect from the through electrode to the conductive particles in the surface layer of the elastic resin so that electrical conduction can be achieved.

Next, in a state where the conductive particles are fixed by applying a magnetic field, the conductive particles are cured in an oven at a temperature of 100 to 200° C. for 0.5 to 3 hours, and further cured at a temperature of 150 to 250° C. for 1 to 4 hours. The inspection probe sheet having a conductive elastomer in a recess of the through electrode can thus be obtained.

2. Inspection Method of Electrical Characteristics

An electrical characteristics inspection method according to this technology includes pasting step (A) of pasting, on an electrode surface of an inspection object, an inspection probe sheet including a flexible sheet, a through electrode having a recess that is recessed from one surface of the flexible sheet, and a conductive elastomer disposed in the recess of the through electrode to bring the conductive elastomer into contact with the electrode of the inspection object, and an inspection step (B) of pressing a probe against the through electrode from the other surface of the flexible sheet, and inspecting electrical characteristics. The electrical characteristics can thus be inspected even when an oxide film is formed on the pads or bumps of the inspection object, since the conductive particles in the conductive elastomer break through the oxide film.

An example of the inspection object is a semiconductor device. The semiconductor device may be at wafer level formed on a wafer, singulated chip level, or package level after packaging. The following describes a pasting step (A), an inspection step (B), and a peeling step (C) of peeling an inspection probe sheet from a semiconductor device after the inspection step with regard to an electrical characteristics inspection method at the chip level of a semiconductor device. It should be noted that the inspection probe sheet in this section is similar to the inspection probe sheet described above, and description thereof is omitted here.

Pasting Step (A)

In the pasting step (A), an inspection probe sheet is pasted on an electrode surface of an inspection object, to bring the conductive elastomer into contact with the electrodes of the inspection object. Moreover, in the pasting step (A), it is preferable to apply a pressure to the inspection probe sheet. The electrical characteristics can thus be inspected even when an oxide film is formed on the pads or bumps of the inspection object, since the conductive particles in the conductive elastomer break through the oxide film.

Inspection Step (B)

Figure 4:
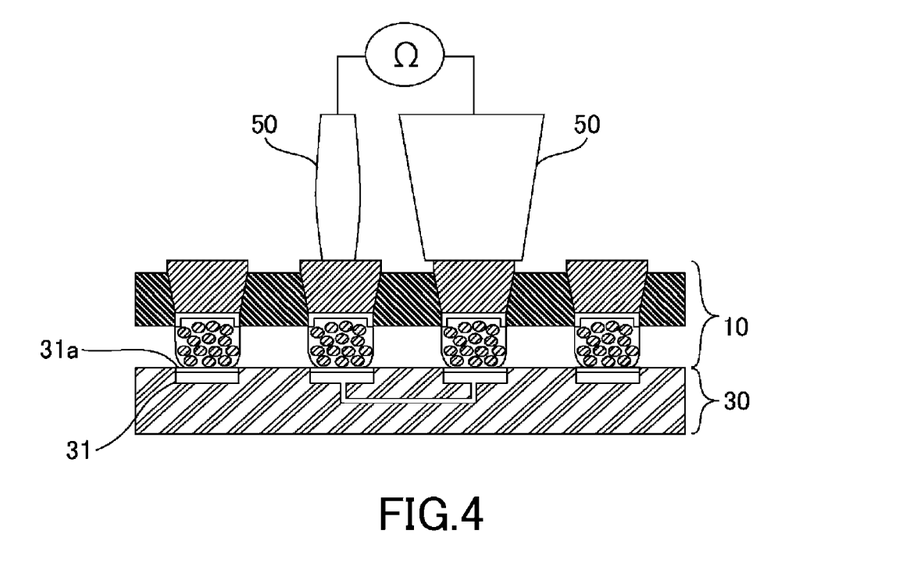
FIG. 4 is a cross-sectional view schematically illustrating an inspection step of inspecting electrical characteristics using the inspection probe sheet according to the first embodiment.
Figure 5:
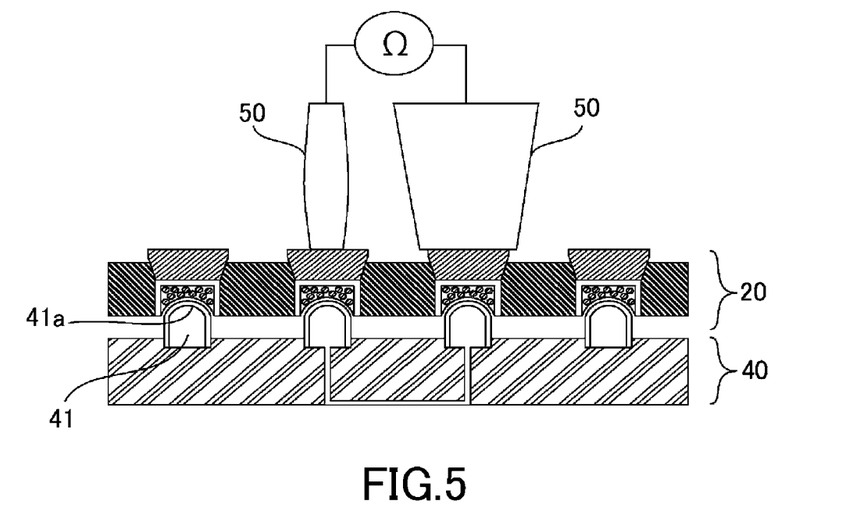
FIG. 5 is a cross-sectional view schematically illustrating an inspection step of inspecting electrical characteristics using the inspection probe sheet according to the second embodiment.

FIG. 4 is a cross-sectional view schematically illustrating an inspection step of inspecting electrical characteristics using the inspection probe sheet according to the first embodiment, and FIG. 5 is a cross-sectional view schematically illustrating an inspection step of inspecting electrical characteristics using the inspection probe sheet according to the second embodiment.

As shown in FIGS. 4 and 5, in the inspection step (B), the wire probe 50 is pressed against the through electrodes 12 and 22 from the other surfaces 10b and 20b of the flexible sheets 10 and 20 to inspect the electrical characteristics. When the wire probe 50 is pressed down, the conductive particles in the conductive elastomer are considered to break through the oxide film 31a, 41a of the pads 41 or bumps 31.

The probe 50 is a probe for inspecting electrical characteristics and is preferably directed vertically to the electrode surface of the through electrode as shown in FIGS. 4 and 5. The probe 50 may include a plurality of arranged pins. The tip shape of the probe 50 is not particularly limited, and may be a spherical surface, a flat surface, a concave surface, or a sawtooth surface, among others. The tip diameter of the probe 50 is preferably smaller than the width of the electrode in the case that the electrode of the through electrode does not protrude; however, in the case that the electrode of the through electrode protrudes, the diameter of the probe may be larger than the width of the electrode as long as the probe does not make a short-circuit to adjacent electrodes.

The electrical characteristics are inspected, for example, by measuring the characteristics of transistors, resistors (electrical resistance), and capacitors, among others.

Peeling Step (C)

In the peeling step (C), the inspection probe sheet is peeled from the inspection object. Moreover, the inspection object may be cleaned after peeling of the inspection probe sheet. In addition, the peeled inspection probe sheet may be used multiple times.

3. Example

EXAMPLES

Hereinafter, examples of the present invention will be described. In this example, an electrical characteristics inspection tool was prepared, and a conduction inspection of a bare chip was performed using this. Next, the presence or absence of scratches on the pad after the conduction inspection was evaluated. It should be noted that the present invention is not limited to these examples.

Example 1

Preparation of a Flexible Sheet Having a Through Electrode

In a sheet in which copper is laminated on both sides of a polyimide sheet (trade name: S'PERFLEX, copper thickness 8 μm, polyimide thickness 25 μm, Sumitomo Metal Mining Co., Ltd.), through holes with a diameter of 30 μm are formed at a grid spacing of 60 μm P by laser processing and the through holes are copper plated by electrolytic plating to form through electrodes. The through electrodes were half-formed in which a recess of a 15 μm groove is formed in the thickness direction from the sheet surface. Next, after plating with nickel and gold was performed, the copper layers on the front and back surfaces were removed by etching to form a flexible sheet. Nickel-gold plating was also performed on the polyimide surface on the side surface of the recess.

Preparation of Conductive Elastomer Dispersion

Conductive particles were prepared by applying a gold plating layer on the surface of nickel particles (Type 123, manufactured by Vale) having an average particle diameter of 5 μm by electroless displacement plating. As an elastomer, a two-part liquid silicone (KE-1204A/B, manufactured by Shin-Etsu Silicone Co., Ltd.) agents A and B are compounded by a ratio of 1:1 and the conductive particles are mixed with this to obtain a conductive elastomer dispersion.

Preparation of Inspection Probe Sheet

Using a small amount dispenser (manufactured by MUSASHI ENGINEERING, INC.) the conductive elastomer dispersion was uniformly applied to the recess side of the through electrode of the flexible sheet so that the conductive elastomer protrudes 10 μm from the sheet surface. The flexible sheet was placed on a permanent magnet with the coated side up, fixed, cured in an oven at a temperature of 160° C. for 1 hour, and further cured at a temperature of 200° C. for 2 hours. Thus, an inspection probe sheet was prepared in which the conductive elastomer was protruded by 10 μm from the surface of the flexible sheet.

Conduction Inspection

As a bare chip for evaluation, a 6 mm square bare chip (Dexerials evaluation base material) in which aluminum pads with a diameter of 30 μm are arranged at 60 μm P is used to perform a conduction resistance inspection using a 30 μm φ wire probe (manufactured by Tepplo). More specifically, as shown in FIG. 2, the circuit surface of the evaluation bare chip and the conductive elastomer surface of the inspection probe sheet are aligned and pressed so as to bring the wire probe into contact with the electrode surface of the inspection probe sheet at a load of 5 g/pin to perform conduction inspection.

The presence or absence of scratches on the aluminum pad after the conduction inspection and the conduction resistance value are shown in Table 1. The scratches on the aluminum pad were not visually found and the conduction inspection was successful. This is considered to be because the conductive particles in the conductive elastomer broke through the oxide film of the aluminum pad.

Comparative Example 1

In the same conduction inspection of Example 1, the wire probe was brought into direct contact with the aluminum pad of the evaluation bare chip at a load of 5 g/pin to perform a conduction inspection without using the inspection probe sheet.

The presence or absence of scratches on the aluminum pad after the conduction inspection and the conduction resistance value are shown in Table 1. The scratches on the aluminum pad were not visually found and the conduction inspection was failed. This is considered to be because the wire probe could not break through the oxide film of the aluminum pad.

Comparative Example 2

In the same conduction inspection of Example 1, after scratching the aluminum pad of the evaluation bare chip with a wire pin, the wire probe was brought into direct contact with the aluminum pad at a load of 5 g/pin to perform a conduction inspection without using the inspection probe sheet.

The presence or absence of scratches on the aluminum pad after the conduction inspection and the conduction resistance value are shown in Table 1. The scratches on the aluminum pad were visually found and the conduction inspection was successful. This is considered to be because the aluminum pad was scratched in advance with a wire pin to remove the oxide film.

TABLE 1

| | Ex. 1 | Comp. 1 | Comp. 2 |
|---|---|---|---|
| scratches on pad | absent | absent | present |
| conduction resistance [Ω] | 0.05 | OPEN | 0.05 |

Example 2

Preparation of a Flexible Sheet Having a Through Electrode

A flexible sheet having through electrodes was prepared in the same manner as in Example 1.

Preparation of Conductive Elastomer Dispersion

Conductive particles were prepared by applying a gold plating layer on the surface of Ni/Au plated resin core particles (manufactured by Sekisui Chemical Co., Ltd.) having an average particle diameter of 2.5 μm by electroless displacement plating. As an elastomer, a two-part liquid silicone (KE-1204A/B, manufactured by Shin-Etsu Silicone CO., Ltd.) agents A and B are compounded by a ratio of 1:1 and the conductive particles are mixed with this to obtain a conductive elastomer dispersion.

Preparation of Inspection Probe Sheet

Using a small amount dispenser (manufactured by MUSASHI ENGINEERING, INC.), the conductive elastomer dispersion was uniformly applied to the recess side of the through electrode of the flexible sheet so that the conductive elastomer was recessed 5 μm from the sheet surface. The flexible sheet was placed on an electromagnet with the coated side up, fixed, cured in an oven at a temperature of 160° C. for 1 hour, and further cured at a temperature of 200° C. for 2 hours. Thus, an inspection probe sheet was prepared in which the conductive elastomer was recessed by 5 μm from the surface of the flexible sheet.

Conduction Inspection

As a bare chip for evaluation, using a 6 mm square bare chip (Dexerials evaluation substrate) in which solder-capped copper pillar bumps (hereinafter referred to as solder bumps) with 20 μm height and 30 μm φ are arranged at 60 μm P is used to perform a conduction resistance inspection using a 30 μm φ wire probe (manufactured by Tepplo). More specifically, as shown in FIG. 3, the circuit surface of the evaluation bare chip and the conductive elastomer surface of the inspection probe sheet are aligned and pressed so as to bring the wire probe into contact with the electrode surface of the inspection probe sheet at a load of 5 g/pin to perform conduction inspection.

The presence or absence of scratches on the aluminum pad after the conduction inspection and the conduction resistance value are shown in Table 2. The scratches on the aluminum pad were not visually found and the conduction inspection was successful. This is considered to be because the conductive particles in the conductive elastomer broke through the oxide film of the solder bump.

Comparative Example 3

In the same conduction inspection of Example 2, the wire probe was brought into direct contact with the solder bumps of the evaluation bare chip at a load of 5 g/pin to perform a conduction inspection without using the inspection probe sheet.

The presence or absence of scratches on the solder bumps after the conduction inspection and the conduction resistance value are shown in Table 2. The scratches on the aluminum pad were not visually found and the conduction inspection was failed. This is considered to be because the wire probe could not break through the oxide film of the solder bump.

Comparative Example 4

In the same conduction inspection of Example 2, after scratching the solder bumps of the evaluation bare chip with a wire pin, the wire probe was brought into direct contact with the solder bumps at a load of 5 g/pin to perform a conduction inspection without using the inspection probe sheet.

The presence or absence of scratches on the aluminum pad after the conduction inspection and the conduction resistance value are shown in Table 2. The scratches on the solder bump were visually found and the conduction inspection was successful. This is considered to be because the solder bump was scratched in advance with a wire pin to remove the oxide film.

TABLE 2

|  | Ex. 2 | Comp. 3 | Comp. 4 |
|---|---|---|---|
| scratches on bump | absent | absent | present |
| conduction resistance [Ω] | 0.05 | OPEN | 0.05 |

DESCRIPTION OF SYMBOLS

10 inspection probe sheet, 11 flexible sheet, 11a one surface, 11b other surface, 12 through electrode, 12a recess, 12b protrusion, 12c metal plating film, 13 conductive elastomer, 13a protrusion height, 20 inspection probe sheet, 21 flexible sheet, 21a one surface, 21b other surface, 22 through electrode, 22a recess, 22b protrusion, 23 conductive elastomer, 23a recession depth, 30 semiconductor device, 31 bump, 31a oxide film, 40 semiconductor device, 41 pad, 41a oxide film, 50 wire probe

The invention claimed is:

1. An electrical characteristics inspection tool comprising:
   a flexible sheet;
   a through electrode having a recess that is recessed from one surface of the flexible sheet; and
   a conductive elastomer disposed in the recess of the through electrode,
   wherein the through electrode and a side surface of the recess are coated with a metal plating film.

2. The electrical characteristics inspection tool according to claim 1, wherein the conductive elastomer protrudes from the one surface of the flexible sheet.

3. The electrical characteristics inspection tool according to claim 1, wherein the conductive elastomer is recessed from the one surface of the flexible sheet.

4. The electrical characteristics inspection tool according to claim 1, wherein the through electrode has a protrusion that protrudes from the other surface of the flexible sheet.

5. An electrical characteristics inspection method comprising:
   a pasting step of pasting, on an electrode surface of an inspection object, an inspection probe sheet including a flexible sheet, a through electrode having a recess that is recessed from one surface of the flexible sheet, and a conductive elastomer disposed in the recess of the through electrode to bring the conductive elastomer into contact with the electrode surface of the inspection object; and
   an inspection step of pressing a probe against the through electrode from the other surface of the flexible sheet, and inspecting electrical characteristics,
   wherein the through electrode and a side surface of the recess are coated with a metal plating film.

6. The electrical characteristics inspection method according to claim 5, further comprising:
   a peeling step of peeling the inspection probe sheet from the inspection object after the inspection step.

7. The electrical characteristics inspection method according to claim 5, wherein the inspection object is a semiconductor device.

8. The electrical characteristics inspection method according to claim 6, wherein the inspection object is a semiconductor device.

9. The electrical characteristics inspection tool according to claim 1, wherein a depth of the recess is 20% or more and 80% or less of a thickness of the flexible sheet.

10. The electrical characteristics inspection tool according to claim 1, wherein a cross-sectional area of the through electrode increases from the one surface to the other surface of the flexible sheet.

11. The electrical characteristics inspection tool according to claim 2, wherein a cross-sectional area of the through electrode increases from the one surface to the other surface of the flexible sheet.

12. The electrical characteristics inspection method according to claim 8, wherein a cross-sectional area of the through electrode increases from the one surface to the other surface of the flexible sheet.

13. The electrical characteristics inspection tool according to claim 3, wherein a cross-sectional area of the through electrode increases from the one surface to the other surface of the flexible sheet.

14. The electrical characteristics inspection tool according to claim 2,
   wherein the conductive elastomer includes conductive particles dispersed in an elastic resin, and
   wherein a height of a protrusion formed by the conductive elastomer is 50% or more and 400% or less of the conductive particles.

15. The electrical characteristics inspection method according to claim 5,
   wherein the electrode surface of the inspection object has a bump, and
   wherein a depth of the conductive elastomer in the recess is 10% or more and 90% or less of a height of the bump.

16. The electrical characteristics inspection method according to claim 7,
   wherein the electrode surface of the inspection object has a bump, and
   wherein a depth of the conductive elastomer in the recess is 10% or more and 90% or less of a height of the bump.

17. The electrical characteristics inspection method according to claim 5, wherein a cross-sectional area of the through electrode increases from the one surface to the other surface of the flexible sheet.

* * * * *